(12) United States Patent
Matsudo et al.

(10) Patent No.: US 9,163,931 B2
(45) Date of Patent: Oct. 20, 2015

(54) APPARATUS AND METHOD FOR MEASURING THICKNESS AND TEMPERATURE AND SUBSTRATE PROCESSING SYSTEM

(71) Applicant: TOKYO ELECTRON LIMITED, Tokyo (JP)

(72) Inventors: Tatsuo Matsudo, Yamanashi (JP); Chishio Koshimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/576,478

(22) Filed: Dec. 19, 2014

(65) Prior Publication Data
US 2015/0176974 A1 Jun. 25, 2015

(30) Foreign Application Priority Data
Dec. 20, 2013 (JP) .................. 2013-263997

(51) Int. Cl.
*H01L 21/67* (2006.01)
*G01B 11/06* (2006.01)
*H01L 21/66* (2006.01)

(52) U.S. Cl.
CPC .......... *G01B 11/06* (2013.01); *H01L 21/67069* (2013.01); *H01L 22/12* (2013.01)

(58) Field of Classification Search
CPC ... G01B 11/06; H01L 21/67069; H01L 22/12
See application file for complete search history.

(56) References Cited

U.S. PATENT DOCUMENTS

| 2006/0176490 | A1 | 8/2006 | Suzuki et al. |
| 2009/0026170 | A1 | 1/2009 | Tanaka et al. |
| 2010/0195090 | A1* | 8/2010 | Ohtake .......................... 356/51 |

FOREIGN PATENT DOCUMENTS

| EP | 2722639 A1 * | 4/2014 |
| JP | 2004-333366 A | 11/2004 |
| JP | 2006-220461 A | 8/2006 |
| JP | 2008-227063 A | 9/2008 |

* cited by examiner

*Primary Examiner* — Mark R Gaworecki
(74) *Attorney, Agent, or Firm* — Rothwell, Figg, Ernst & Manbeck, P.C.

(57) ABSTRACT

An apparatus for measuring a thickness or wear amount and a temperature of the ceramic member by using a terahertz wave includes a terahertz wave generating unit configured to output a terahertz wave, a terahertz wave analysis unit configured to analyze a terahertz wave and an optical system configured to guide the terahertz wave output from the terahertz wave generating unit to the ceramic member and guide reflected waves of the terahertz wave reflected from the ceramic member to the terahertz wave analysis unit. The terahertz wave analysis unit obtains an optical path difference between a first reflection wave reflected from a front surface of the ceramic member and a second reflection wave reflected from a rear surface of the ceramic member and measures a thickness of the ceramic member based on the optical path difference.

11 Claims, 7 Drawing Sheets

APPARATUS AND METHOD FOR MEASURING THICKNESS AND TEMPERATURE AND SUBSTRATE PROCESSING SYSTEM

CROSS-REFERENCE TO RELATED APPLICATIONS

This application claims priority to Japanese Patent Application No. 2013-263997 filed on Dec. 20, 2013, the entire contents of which are incorporated herein by reference.

FIELD OF THE INVENTION

The present invention relates to an apparatus and a method for measuring a thickness (or wear amount) and a temperature of a component, and a substrate processing system which applies the apparatus and the method for measuring a thickness and a temperature of a component to a substrate processing apparatus.

BACKGROUND OF THE INVENTION

In a substrate processing apparatus for performing plasma etching or the like on a semiconductor wafer, components made of various materials are provided in a processing chamber where the semiconductor wafer is accommodated. Some of the components are worn by a plasma. Therefore, there are suggested various methods that measure a wear amount of a component to check replacement timing of the worn component.

For example, there is suggested a method for measuring a wear amount of a focus ring based on a thickness of the focus ring which is measured by using interference between reflected light from a front surface of the focus ring and reflected light from a rear surface of the focus ring in the case of irradiating low-coherence light in a thickness direction of the focus ring in a processing chamber (see, e.g., Japanese Patent Application Publication No. 2008-227063). The method disclosed in Japanese Patent Application Publication No. 2008-227063 utilizes principle that an optical path difference between the reflected light from the front surface and the reflected light from the rear surface of the component to which the low-coherence light is irradiated is changed by thermal expansion depending on a temperature of the component. There is also suggested a method for measuring a temperature of a component by using low-coherence light based on the above principle (see, e.g., Japanese Patent Application Publication No. 2006-220461).

The wear amount measuring method disclosed in Japanese Patent Application Publication No. 2008-227063 and the temperature measuring method disclosed in Japanese Patent Application Publication No. 2006-220461 can be applied to a component made of a material, e.g., Si, which transmits a wavelength of the low-coherence light. However, such methods cannot be used for measuring a thickness or wear amount and a temperature of a component made of a material, e.g., ceramic or the like, which does not transmit the low-coherence light.

Therefore, it is general to take out a ceramic member as a measurement target component from the processing chamber and measure a thickness or wear mount thereof by using a three-dimensional measuring device. In addition, there is suggested an ultrasonic diffraction method used for measuring a thickness of a ceramic film formed on a surface of a ceramic member (see, Japanese Patent Application Publication No. 2004-333366).

However, the thickness measurement using the three-dimensional measurement device or the thickness measurement using ultrasonic diffraction method is a contact-type measuring method and thus cannot be used in a state where the ceramic member is disposed in the processing chamber. In that case, it is required to expose the inside of the processing chamber to the atmosphere, take out the ceramic member from the processing chamber, measure a thickness of the ceramic member at the outside of the chamber, return the ceramic member into the processing chamber after the thickness measurement, and depressurize the inside of the processing chamber to a vacuum state. Accordingly, the operating rate of the substrate processing apparatus is considerably decreased. Further, a temperature of a ceramic member provided in a processing chamber cannot be measured by the three-dimensional measuring device or the ultrasonic diffraction method.

SUMMARY OF THE INVENTION

In view of the above, the present invention provides an apparatus and a method capable of measuring a thickness (or wear amount) and a temperature of a ceramic member provided in a processing chamber at desired timing, and a substrate processing system which applies the apparatus and the method for measuring a thickness and a temperature of a component to a substrate processing apparatus.

In accordance with an aspect of the present invention, there is provided an apparatus for measuring at least a thickness of a ceramic member provided in a chamber maintained in a vacuum atmosphere, the apparatus including: a terahertz wave generating unit configured to output a terahertz wave; a terahertz wave analysis unit configured to analyze a terahertz wave; and an optical system configured to guide the terahertz wave output from the terahertz wave generating unit to the ceramic member and guide reflected waves of the terahertz wave reflected from the ceramic member to the terahertz wave analysis unit, wherein the terahertz wave analysis unit obtains an optical path difference between a first reflection wave reflected from a front surface of the ceramic member and a second reflection wave reflected from a rear surface of the ceramic member and measures a thickness of the ceramic member based on the optical path difference.

In accordance with another aspect of the present invention, there is provided a method for measuring at least a thickness of a ceramic member provided in a chamber maintained in a vacuum atmosphere, the method including: making a terahertz wave incident on the ceramic member; obtaining an optical path difference between reflection waves of the terahertz wave reflected from a front surface and a rear surface of the ceramic member; and obtaining the thickness of the ceramic member based on the optical path difference.

In accordance with still another aspect of the present invention, there is provided a substrate processing system including: a substrate processing apparatus including: a chamber in which a mounting table configured to mount thereon a substrate is provided, the chamber configured to perform a predetermined process on the substrate mounted on the mounting table in a vacuum atmosphere; a ceramic member provided in the chamber; and a window made of a material that transmits a terahertz wave and provided at the chamber, to introduce the terahertz wave into the chamber; and a thickness/temperature measuring apparatus configure to measure at least a thickness of the ceramic member, wherein the thickness/temperature measuring apparatus includes: a terahertz wave generating unit configured to output a terahertz wave; a terahertz wave analysis unit configured to analyze a terahertz wave; and an optical system configured to guide the terahertz wave output from the terahertz wave generating unit to the ceramic member in the chamber through the window and guide reflection waves of the terahertz wave reflected from the ceramic member to the terahertz wave analysis unit through the window, and wherein the terahertz wave analysis unit obtains an optical path difference between a first reflection wave from a front surface of the ceramic member and a second reflection wave from a rear surface of the ceramic member and measures a thickness of the ceramic member based on the optical path difference.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings. Here, a substrate processing system which applies a thickness/temperature measuring apparatus in accordance with an embodiment of the present invention to a substrate processing apparatus for performing plasma etching on a semiconductor wafer (hereinafter, referred to as "wafer") as a substrate will be described as an example.

Figure 1:
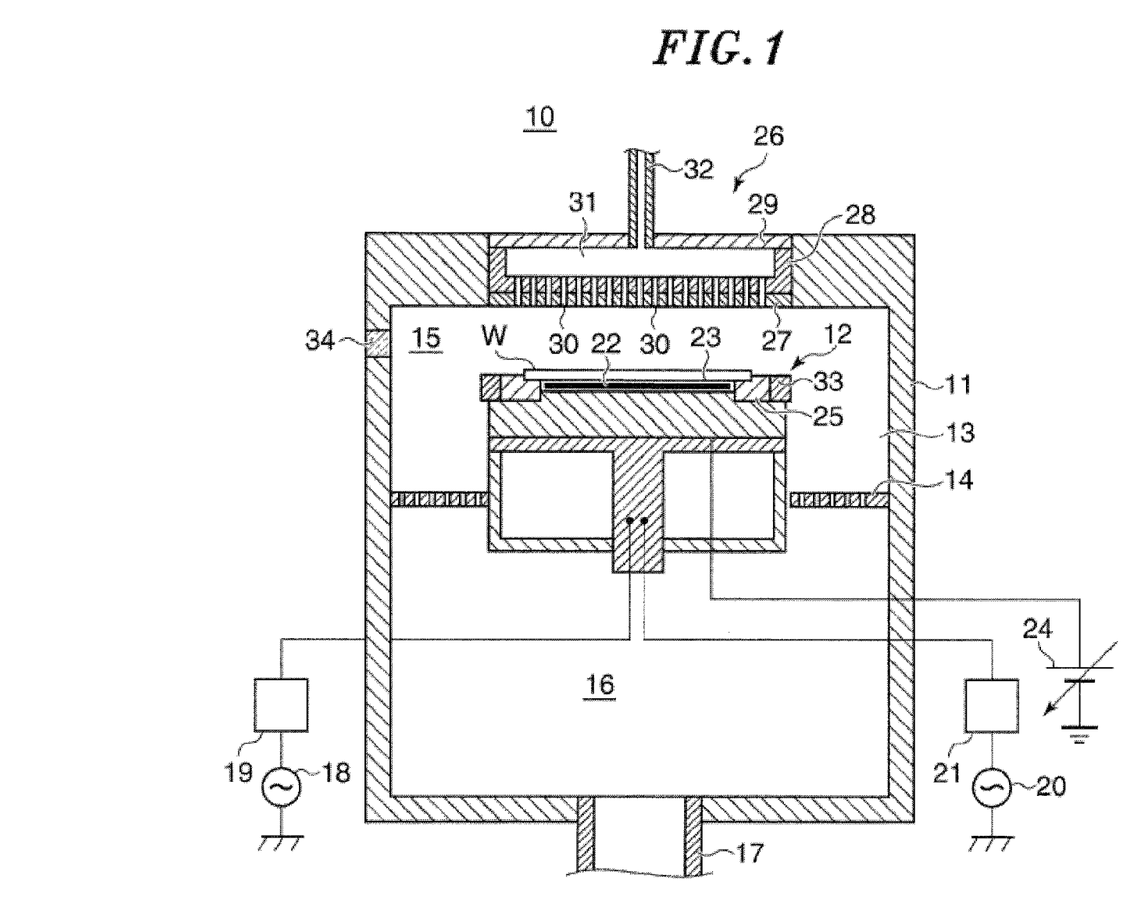
FIG. 1 is a cross sectional view showing a schematic configuration of a substrate processing apparatus to which a thickness/temperature measuring apparatus in accordance with an embodiment of the present invention can be applied.

FIG. 1 is a cross sectional view showing a schematic configuration of a substrate processing apparatus 10 to which a thickness/temperature measuring apparatus in accordance with an embodiment of the present invention can be applied.

The substrate processing apparatus 10 shown in FIG. 1 includes a chamber 11 where a semiconductor device wafer having a diameter of, e.g., 300 mm, is accommodated. A cylindrical susceptor 12 (mounting table) for mounting thereon the wafer W is provided in the chamber 11. In the substrate processing apparatus 10, a side exhaust passageway 13 is formed between a side surface of the susceptor 12 and an inner wall of the chamber 11. A gas exhaust plate 14 is provided in the middle of the side exhaust passageway 13.

The gas exhaust plate 14 is a plate-shaped member having a plurality of through holes. The gas exhaust plate 14 serves as a partition plate for partitioning the inner space of the chamber 11 into an upper portion and a lower portion. As will be described later, a plasma is generated in a processing chamber 15 defined at the upper portion of the chamber 11 by the gas exhaust plate 14. A gas exhaust line 17 through which gas in the chamber 11 is discharged is connected to a gas exhaust chamber (manifold) 16 defined at the lower portion of the chamber 11 by the gas exhaust plate 14. The gas exhaust plate 14 captures or reflects the plasma generated in the processing chamber 15 to prevent leakage of the plasma to the manifold 16.

A TMP (Turbo Molecular Pump) and a DP (Dry Pump) (both not shown) are connected to the gas exhaust line 17. The chamber 11 is evacuated and depressurized by those pumps. Specifically, the DP depressurizes the inside of the chamber 11 from the atmospheric pressure to a medium vacuum state (e.g., $1.3 \times 10$ Pa (0.1 Torr) or less). Then, the TMP further reduces the pressure of the chamber 11 to a high vacuum state (e.g., $1.3 \times 10^{-3}$ Pa ($1.0 \times 10^{-5}$ Torr) or less) in cooperation with the DP. Further, the pressure in the chamber 11 is controlled by an APC valve (not shown).

The susceptor 12 in the chamber 11 is connected to a first high frequency power supply 18 via a first matching unit 19 and also connected to a second high frequency power supply 20 via a second matching unit 21. The first high frequency power supply 18 applies a high frequency power for ion attraction which has a relatively low frequency, e.g., 2 MHz, to the susceptor 12. Meanwhile, the second high frequency power supply 20 applies a high frequency power for plasma generation which has a relatively high frequency, e.g., 60 MHz, to the susceptor 12. Accordingly, the susceptor 12 serves as an electrode. Further, the first matching unit 19 and the second matching unit 21 maximize the efficiency of applying the high frequency power to the susceptor 12 by reducing reflection of the high frequency power from the susceptor 12.

At the upper portion of the susceptor 12, a small-diameter cylinder protrudes coaxially from a front surface of a large-diameter cylinder, so that a stepped portion is formed so as to surround the small-diameter cylinder. An electrostatic chuck 23 made of ceramic and having therein an electrostatic electrode plate 22 is provided at a front surface of the small-diameter cylinder. A DC power supply is connected to the electrostatic electrode plate 22. When a positive DC voltage is applied to the electrostatic electrode plate 22, a negative potential is generated on a surface (backside) of the wafer W which faces the electrostatic chuck 23. Accordingly, a potential difference is generated between the electrostatic electrode plate 22 and the backside of the wafer W. The wafer W is attracted and held on the electrostatic chuck 23 by Coulomb force or Johnson Rahbeck force generated by the potential difference.

A focus ring 25 that is a ring-shaped member is mounted on the stepped portion formed at the upper portion of the susceptor 12 to surround the wafer W attracted and held on the electrostatic chuck 23. The focus ring 25 is made of, e.g., silicon. Since the focus ring is made of a semiconductor, the plasma distribution region is extended from a space above the wafer W to a space above the focus ring 25. Accordingly, the plasma density on the peripheral portion of the wafer W is maintained at a level substantially equal to that on the central portion of the wafer W. As a result, the plasma etching can be uniformly performed on the entire surface of the wafer W.

A cover ring 33 made of an insulating material (ceramic such as yttria $Y_2O_3$ or the like) is provided so as to surround an outer periphery of the focus ring 25. The cover ring 33 protects the susceptor 12 or the electrostatic chuck 23 and the focus ring 25 from the plasma.

A shower head 26 is provided at a ceiling portion of the chamber 11 so as to face the susceptor 12. The shower head 26 includes an upper electrode plate 27, a cooling plate 28 detachably holding the upper electrode plate 27, and a cover 29 covering the cooling plate 28. The upper electrode plate 27 is made of a semiconductor, e.g., Si, and is formed of a circular plate-shaped member having a plurality of gas holes 30 penetrating therethrough in a thickness direction thereof.

A buffer space 31 is provided in the cooling plate 28, and a processing gas inlet line 32 is connected to the buffer space 31. In the substrate processing apparatus 10, a processing gas supplied into the buffer space 31 from the processing gas inlet line 32 is introduced into the processing chamber 15 through the gas holes 30. The processing gas introduced into the processing chamber 15 is excited into a plasma by the high frequency power for plasma generation which is applied from the second high frequency power supply 20 to the processing chamber 15 via the susceptor 12. Ions in the plasma are attracted toward the wafer W by the high frequency power for ion attraction which is applied from the first high, frequency power supply 18 to the susceptor 12. As a consequence, the plasma etching is performed on the wafer W.

In the substrate processing apparatus 10 configured as described above, a window 34 for introducing a terahertz wave into the chamber 11 is provided at a part of a sidewall of the chamber 11 in order to measure a thickness (or wear amount) and a temperature of a ceramic member provided in the chamber 11, e.g., the cover ring 33, or a ceramic member used for an inner wall of the chamber 11, e.g., a thermally sprayed yttria film (not shown) or the like. The window 34 is made of a material that transmits a terahertz wave, e.g., Si.

Hereinafter, the thickness/temperature measuring apparatus provided at the substrate processing apparatus 10 to measure a thickness or wear amount and a temperature of the ceramic member disposed in the chamber 11 will be described.

In the present embodiment, a thickness or wear amount and a temperature of the ceramic member is measured by using a terahertz wave. The terahertz wave is an electromagnetic wave having a frequency of about 100 GHz to 10 THz and a wavelength of about several hundreds of microns. The terahertz wave can transmit through a material such as ceramic or the like through which visual ray or infrared ray having a shorter wavelength does not transmit. Meanwhile, the terahertz wave has the same characteristics as those of infrared ray, visible ray or the like, so that an interferometer using the terahertz wave can have the same configuration as the conventional optical interferometer using the infrared ray, the visible ray or the like.

Hereinafter, a thickness/temperature measuring apparatus in accordance with a first embodiment will be described with reference to FIGS. 2 to 3D and a thickness/temperature measuring apparatus in accordance with a second embodiment will be described with reference to and FIGS. 4 to 5B.

Figure 2:
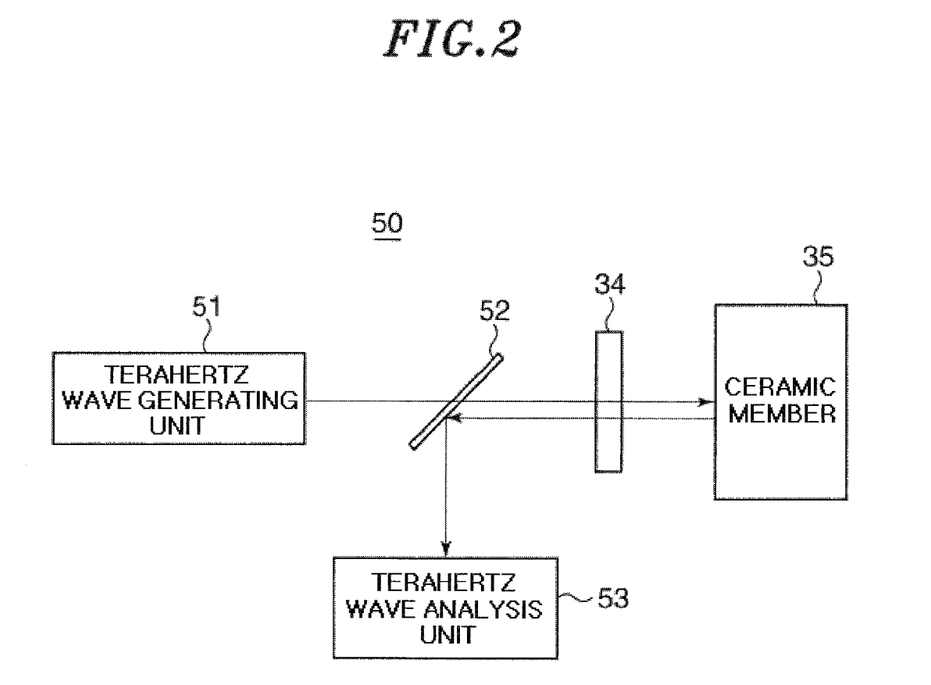
FIG. 2 shows a schematic configuration of a thickness/temperature measuring apparatus in accordance with a first embodiment to be installed at the substrate processing apparatus shown in FIG. 1.

FIG. 2 shows a schematic configuration of the thickness/temperature measuring apparatus of the first embodiment installed at a substrate processing apparatus 10. The thickness/temperature measuring apparatus 50 of the first embodiment includes a terahertz wave generating unit 51, a half mirror 52 and a terahertz wave analysis unit 53. The terahertz wave generating unit 51, the half mirror 52 and the terahertz wave analysis unit 53 are provided outside the chamber 11.

The terahertz wave generating unit 51 includes various elements required for generating a terahertz wave. The various elements of the terahertz wave generating unit 51 may include: a terahertz wave generating element (e.g., a photoconductive device for generating a terahertz wave which is formed on a low-temperature growth GaAs); a bias power supply for applying a bias voltage to the terahertz wave generating element; a femtosecond laser light source that is a source of laser beam input as excitation light of the terahertz wave to the terahertz wave generating element; a condensing lens that condenses the laser beam output from the femtosecond laser light source before the laser beam is input to the terahertz wave generation element; a light transmitting lens of the terahertz wave output from the terahertz wave generating element; and the like.

The half mirror 52 is a component constituting an optical system for guiding a terahertz wave output from the terahertz wave generating unit 51 to the ceramic member 35 disposed in the chamber 11 through the window 34 provided at the sidewall of the chamber 11 and guiding reflection waves from the front surface and the rear surface of the ceramic member 35 to the terahertz wave analysis unit 53.

Meanwhile, the terahertz wave cannot transmit an optical fiber and thus the terahertz wave is guided into the chamber 11 through the window 34. Although it is not shown in FIG. 1, in order to guide the terahertz wave that has been introduced into the chamber 11 to the ceramic member 35 to be measured, various optical components such as an elliptic mirror, a parabolic mirror and the like are provided in the processing chamber 15, if necessary, while protecting the plasma generated in the processing chamber 15 from being adversely affected. The optical components may be configured to be movable between a working (measuring) position and a retreat position inside the chamber 11.

The terahertz wave analysis unit 53 includes various elements required for dispersing (detecting) and analyzing the reflection wave of the input terahertz wave from the ceramic member 35. The various elements of the terahertz wave analysis unit 53 may include: a condensing lens for condensing the reflection wave from the ceramic member 35; a terahertz wave detecting element (e.g., a photoconductive element for detecting a terahertz wave which is formed on a low-temperature growth GaAs) for dispersing the terahertz wave (reflection wave) received through the condensing lens; a computer for analyzing an output signal from the terahertz wave detecting element; and the like.

Figure 3A:
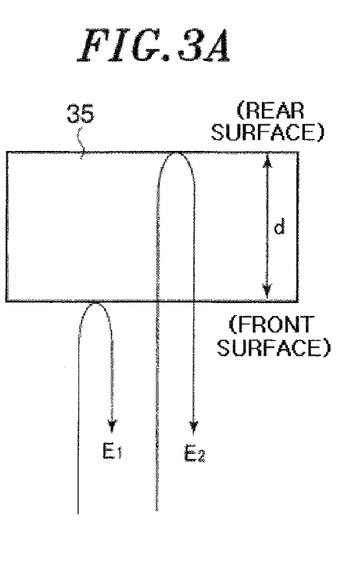
FIGS. 3A to 3D explain principle of thickness/temperature measurement using the terahertz wave in the thickness/temperature measuring apparatus shown in FIG. 2.

FIGS. 3A to 3D explain principle of thickness/temperature measurement using a terahertz wave in the thickness/temperature measuring apparatus 50 of the first embodiment. FIG. 3A schematically shows the state of reflection of the terahertz wave at the ceramic member 35. A refractive index of the ceramic member 35 is denoted by "n" and a thickness of the ceramic member 35 is denoted by "d". Here, a portion of the ceramic member 35 to which the terahertz wave is irradiated needs to have a front surface and a rear surface parallel to each other.

A part of the terahertz wave irradiated to the ceramic member 35 is reflected on the front surface of the ceramic member 35 (a first reflection wave E1) and enters the terahertz wave analysis unit 53. Further, a part of the light transmitting through the ceramic member 35 is reflected on the rear surface of the ceramic member 35 (a second reflection wave E2) and enters the terahertz wave analysis unit 53. Since the refractive index n is already known, the thickness d can be calculated by obtaining an optical path difference 2nd between the first reflection wave E1 and the second reflection wave E2. Although a higher-order reflection wave is also generated, the description thereof will be omitted.

Figure 3B:
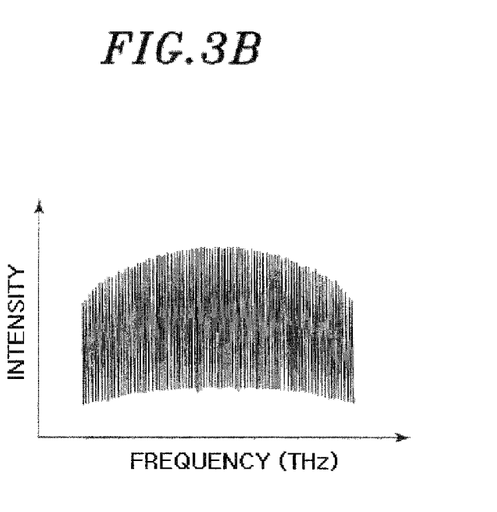
Figure 4:
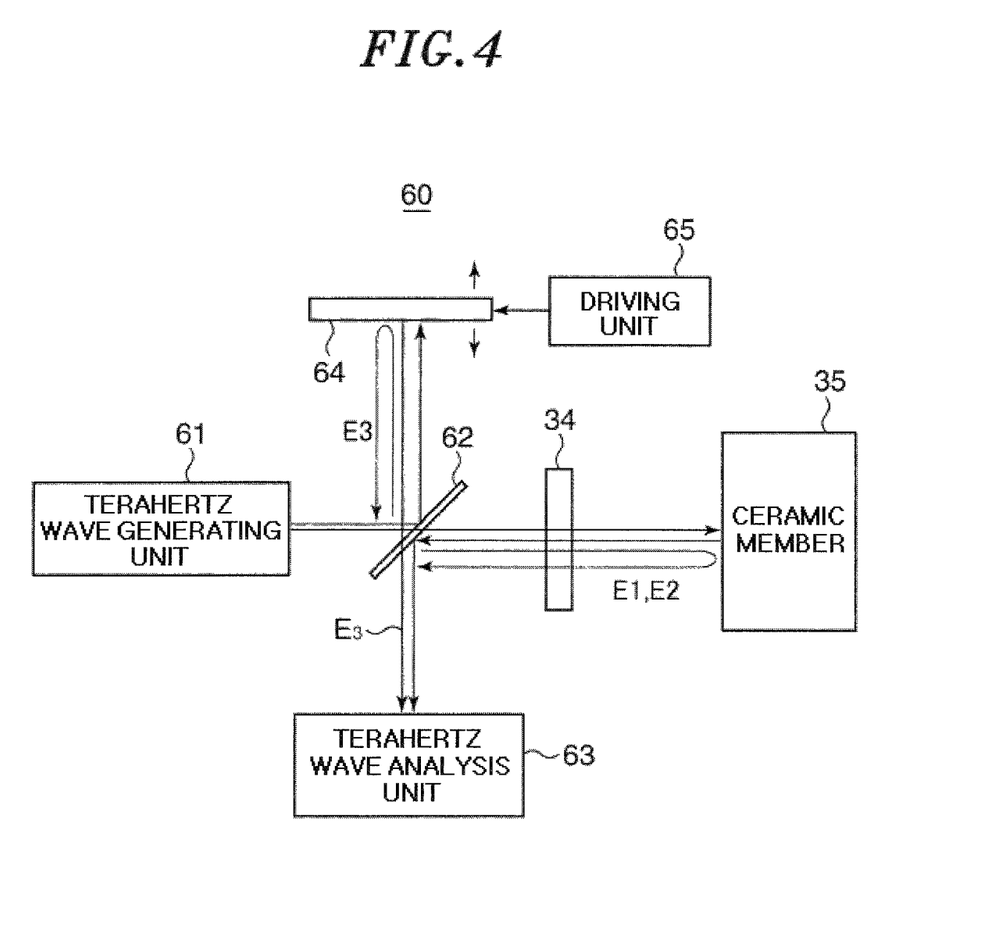
FIG. 4 shows schematic configuration of a thickness/temperature measuring apparatus in accordance with a second embodiment to be installed at the substrate processing apparatus shown in FIG. 1.

FIG. 3B schematically shows spectrum distribution (frequency vs. intensity) of the reflection wave incident on (the terahertz wave detecting element of) the terahertz wave analysis unit 53. If a reflectivity from the front surface and the rear surface of the ceramic member 35 is denoted by "R"; a wavelength of the terahertz wave is denoted by "λ"; a wavenumber is denoted by "k(=2π/λ)"; and spectrum of the terahertz wave incident on the ceramic member 35 is denoted by "S(k)", spectrum distribution I(k) of the reflection wave incident on the terahertz wave analysis unit 53 is expressed by the following equation 1. "cos(2nkd)" in the following equation 1 indicates interference of the reflection waves E1 and E2 between the front surface and the rear surface.

$$I(k) \propto \{2R(1-R)-2R(1-2R)\cos(2nkd)\}S(k) \qquad \text{Eq. 1}$$

Figure 3C:
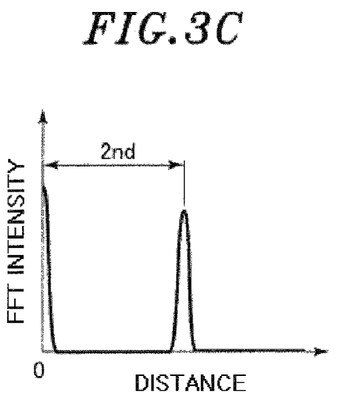

FIG. 3C schematically shows spectrum obtained by performing Fourier transform on the spectrum distribution shown in FIG. 3B. Here, the Fourier transform is a process of converting a function of wavenumber (or frequency or wavelength) variables to a function of distance variables. By performing Fourier transform of the equation 1 by the computer of the terahertz wave analysis unit 53, the following equation 2 is obtained and the spectrum to which the optical path difference 2nd shown in FIG. 3C is applied is obtained. Since the refractive index n is already known, the thickness d of the ceramic member 35 can be calculated by obtaining the optical path difference 2nd from the spectrum shown in FIG. 3C.

$$I(x) = 2R(1-R)\cdot S(x) - R(1-2R) \cdot \{S(x+2nd)+S(x-2nd)\} \qquad \text{Eq. 2}$$

Figure 3D:
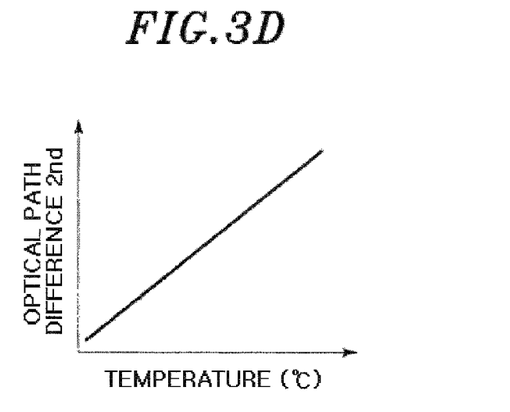

Here, data (graph or table) on the correlation between the temperature and the optical path difference 2nd (or the thickness d) of the ceramic member 35 shown in FIG. 3D is previously obtained by using a black body furnace or the like and stored in a storage device such as a semiconductor memory, a hard disk drive or the like of the computer of the terahertz wave analysis unit 53. The thickness of the ceramic member 35 is changed in accordance with its temperature depending on a thermal expansion coefficient thereof. Therefore, when the temperature of the ceramic member 35 is changed, the thickness d is changed and the optical path difference 2nd is also changed. Accordingly, the temperature of the ceramic member 35 can be obtained from the optical path difference 2nd (or the thickness d) and the graph shown in FIG. 3D.

Next, a thickness/temperature measuring apparatus in accordance with a second embodiment will be described. FIG. 4 shows a schematic configuration of the thickness/temperature measuring apparatus of the second embodiment to be provided at the substrate processing apparatus 10. The thickness/temperature measuring apparatus of the first embodiment obtains the optical path difference 2nd by performing Fourier transform of the reflection wave spectrum. However, the thickness/temperature measuring apparatus 60 of the second embodiment shown in FIG. 4 constitutes a so-called Michelson interferometer and obtains the optical path difference 2nd (or a half thereof nd).

The thickness/temperature measuring apparatus 60 of the second embodiment includes a terahertz wave generating unit 61, a half mirror 62, a terahertz wave analysis unit 63 and a reference mirror 64. The configuration of the terahertz wave generating unit 61 is the same as the terahertz wave generating unit 51 of the thickness/temperature measuring apparatus 50 of the first embodiment.

The half mirror 62 guides a part of the terahertz wave output from the terahertz wave generating unit 61 to the ceramic member 35 disposed in the chamber 11 through the window 34 provided at the sidewall of the chamber 11 and also guides the reflection waves from the front surface and the rear surface of the ceramic member 35 to the terahertz wave analysis unit 63. Further, the half mirror 62 guides a part of the terahertz wave output from the terahertz wave generating unit 61 to the reference mirror 64 and also guides a third reflection wave from the reference mirror 64 to the terahertz wave analysis unit 63.

The reference mirror 64 can be moved by a driving unit 65 in a direction parallel to the incidence direction of the terahertz wave. The terahertz wave analysis unit 63 has the same configuration as that of the terahertz wave analysis unit 53 of the thickness and temperature measuring apparatus 50 of the first embodiment except that the analysis method of the computer is different from that of the terahertz wave analysis unit 53. Meanwhile, the driving unit 65 for moving the reference mirror 64 back and forth is controlled by the computer of the terahertz wave analysis unit 63.

Figure 5A:
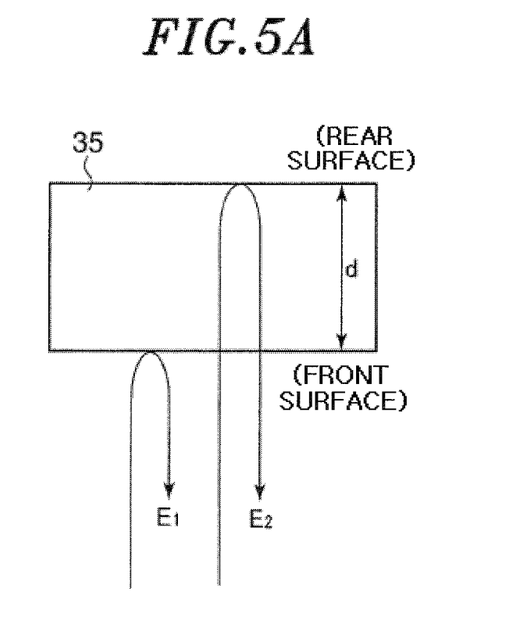
FIGS. 5A and 5B explain principle of thickness/temperature measurement using the terahertz wave in the second thickness/temperature measuring apparatus shown in FIG. 4.
Figure 5B:
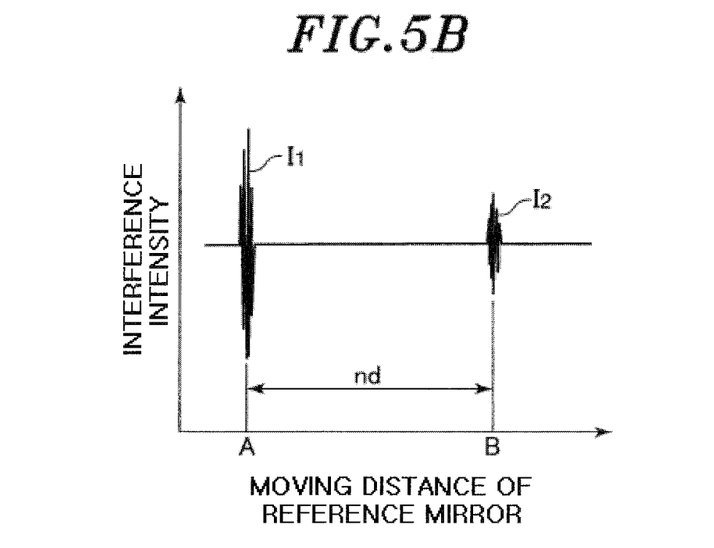

FIGS. 5A and 5B explain principle of thickness/temperature measurement using a terahertz wave in the thickness/temperature measuring apparatus 60 of the second embodiment. FIG. 5A schematically shows the state of reflection of the terahertz wave in the ceramic member 35. Since it is the same as shown in FIG. 3A, the description thereof will be omitted.

In the thickness/temperature measuring apparatus 60 of the second embodiment, the optical length of a third reflection wave E3 (see FIG. 4) from the reference mirror 64 can be changed by moving the reference mirror 64 in a direction parallel to the incidence direction of the terahertz wave. In the thickness/temperature measuring apparatus 60 of the second embodiment, strong interference occurs when an optical path length of the first reflection wave E1 irradiated from the half mirror 62 to the ceramic member 35 and returned to the half mirror 62 by reflection from the front surface of the ceramic member 35 is equal to an optical length of the third reflection wave E3 irradiated from the half mirror 62 to the reference mirror 64 and returned to the half mirror 62 by reflection from the front surface of the reference mirror 64 and when an optical path length of the second reflection wave E2 irradiated from the half mirror 62 to the ceramic member 35 and returned to the half mirror 62 by reflection from the rear surface of the ceramic member 35 is equal to an optical length of the third reflection wave E3 irradiated from the half mirror 62 to the reference mirror 64 and returned to the half mirror 62 by reflection from the front surface of the reference mirror 64.

FIG. 5B shows relation between the moving distance of the reference mirror 64 and the interference waveform of the terahertz wave incident on the terahertz wave analysis unit 63. There are illustrated interference waveforms $I_1$ and $I_2$ showing that strong interference occurs when the reference mirror 64 is positioned at points A and B. A distance between the interference waveforms $I_1$ and $I_2$ corresponds to a half nd of the optical path difference 2nd. Since the refractive index n is already known, the thickness d of the ceramic member 35 can be calculated by obtaining the optical path difference 2nd (or a half thereof nd) from FIG. 5B.

Meanwhile, as in the case of the thickness/temperature measuring apparatus 50 of the first embodiment, the previously obtained data (graph or table) on the correlation between the temperature and the optical path difference of the ceramic member 35 shown in FIG. 3D is stored in the computer of the terahertz wave analysis unit 63. The temperature of the ceramic member 35 can be obtained by measuring the optical path difference 2nd (or a half thereof nd).

As described above, in accordance with the thickness/temperature measuring apparatus 50 of the first embodiment and the thickness/temperature measuring apparatus of the second embodiment, the thickness of the temperature of the ceramic member 35 disposed in the chamber 11 can be measured by a non-contact method and, thus, the replacement timing of the ceramic member 35 or the like can be checked based on the measured thickness of the ceramic member 35. Therefore, it is not necessary to perform conventionally required operations at regular intervals, such as taking out of the ceramic member from the substrate processing apparatus to measure a thickness thereof. This increases the operating rate of the substrate processing apparatus. Accordingly, the productivity can be improved. Further, it is possible to check whether or not the ceramic member 35 has reached a desired temperature or the like. By using the temperature information for controlling, e.g., processing conditions in the substrate processing apparatus 10, the plasma etching can be performed under more appropriate conditions. As a result, the product quality can be increased.

Figure 6:
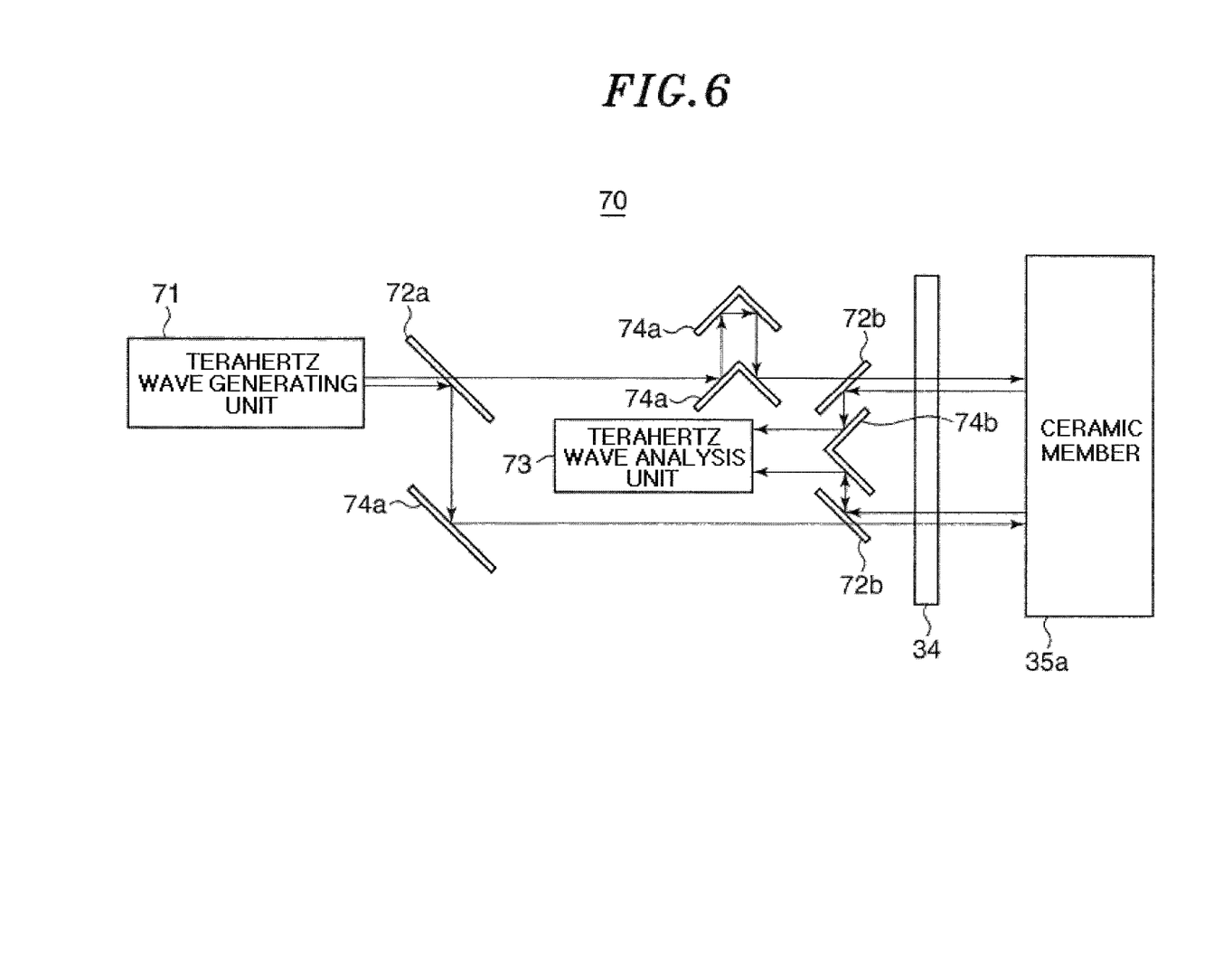
FIG. 6 shows a schematic configuration of a wear amount measuring apparatus to be installed at the substrate processing apparatus shown in FIG. 1.

Next, a wear amount measuring apparatus as a modification of the thickness/temperature measuring apparatus 50 of the first embodiment will be described. FIG. 6 shows a schematic configuration of the wear amount measuring apparatus to be provided at the substrate processing apparatus 10. The wear amount measuring apparatus 70 includes a terahertz wave generating unit 71, a first half mirror 72a, second half mirrors 72b, a terahertz wave analysis unit 73, mirror groups 74a and a mirror 74b.

The terahertz wave generating unit 71 is the same as the terahertz wave generating unit 51 of the thickness/temperature measuring apparatus 50 of the first embodiment. The terahertz wave analysis unit 73 is the same as the terahertz wave analysis unit 53 of the thickness/temperature measuring apparatus 50 of the first embodiment.

The first half mirror 72a, the second half mirrors 72b, the mirror groups 74a and the mirror 74b constitute an optical system for splitting the terahertz wave output from the terahertz wave generating unit 71 into two terahertz waves respectively traveling along two paths having the same optical path length, guiding the terahertz wave to different portions of the ceramic member 35a through the two paths and guiding reflection waves from the respective portions to the terahertz wave analysis unit 73.

Specifically, the first half mirror 72a splits the terahertz wave output from the terahertz wave generating unit into the two terahertz waves traveling along the respectively two paths. Due to the mirror groups 74a, the optical path lengths of the terahertz waves moving through the two paths split by the first half mirror 72a to the front surface of the ceramic member 35a are the same. The second half mirrors 72b guides the terahertz waves moving through the two paths split by the first half mirror 72a to the ceramic member 35a and change the paths of the reflection waves from the ceramic member 35a to be guided to the terahertz wave analysis unit 73. The mirror 74b makes the optical path lengths of the reflection waves reflected from the front surface of the ceramic member 35a to the terahertz wave analysis unit 73 the same.

Figure 7A:
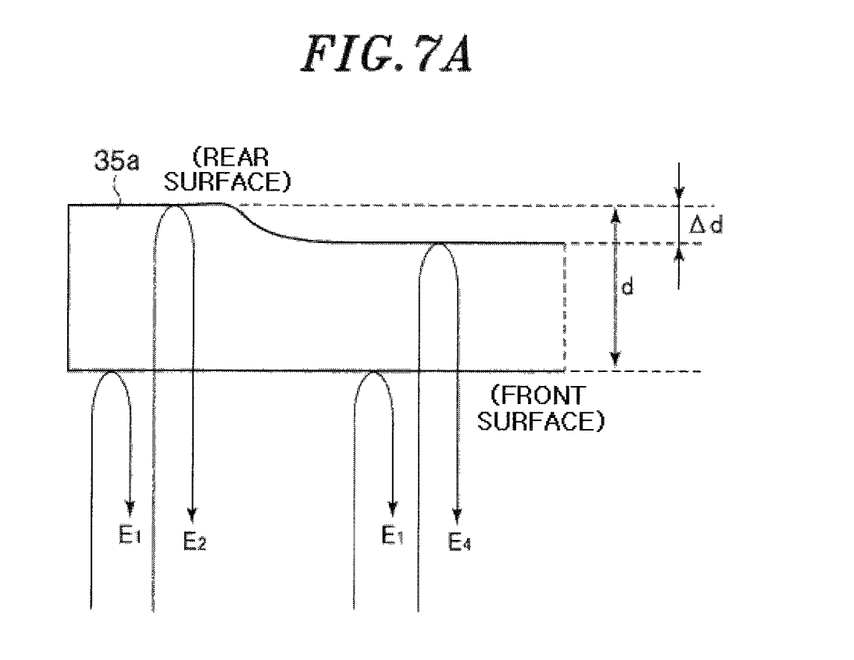
FIGS. 7A and 7B explain principle of wear amount measurement using the terahertz wave in the wear amount measuring apparatus shown in FIG. 6.
Figure 7B:
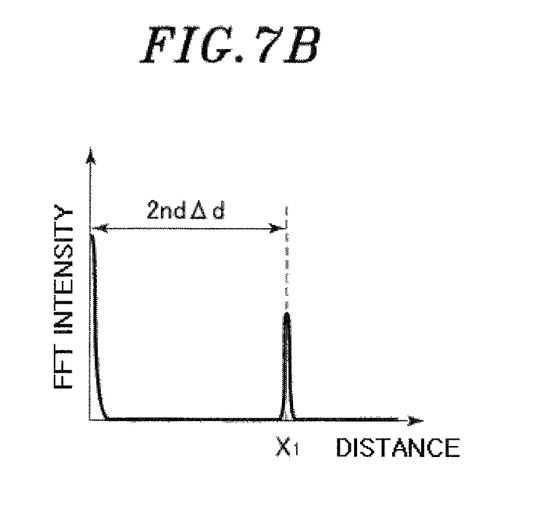

FIGS. 7A and 7B explain principle of wear amount measurement using a terahertz wave in the wear amount measuring apparatus 70. FIG. 7A schematically shows incidence and reflection of the terahertz wave to and from the ceramic member 35a. The initial thickness d of the ceramic member 35a is decreased by a wear amount Δd because the rear surface thereof is partially worn by, e.g., a plasma. One of the terahertz waves incident to the ceramic member 35a through the two paths is incident to a non-wearable area and the other is incident to a wearable area.

As a consequence, an optical path difference 2nΔd is generated between two reflection waves E2 and E4 reflected from the rear surface of the ceramic member 35a. However, this is based on the assumption that the region on the rear surface of the ceramic member 35a where the terahertz wave is reflected is in parallel to the front surface of the ceramic member 35a.

FIG. 7B which corresponds to FIG. 3C schematically shows spectrum obtained by performing Fourier transform of the reflection wave incident on the terahertz wave analysis unit 73. A peak obtained when x is equal to zero is caused by the first reflection wave from the front surface of the ceramic member 35a. A peak obtained when x is equal to x1 indicates a wear amount 2nΔd. In other words, since 2nΔd is equal to x1 and the refractive index n is already known, a wear amount Δd can be obtained by measuring the distance x1. As a result, it is possible to determine whether or not the ceramic member 35a needs to be replaced by measuring the wear amount Δd at regular intervals.

Although one of the split terahertz waves is incident on the non-wearable area of the ceramic member 35a in FIG. 7A, the split two terahertz waves may be incident on any two points of the ceramic member 35a. The wear amount Δd obtained at that time indicates a thickness difference between the two points, i.e., a wear amount difference. Therefore, if the uniformity of processing for the wafer W is decreased due to an increase in the wear amount difference between two points of the ceramic member 35a, for example, whether the ceramic member 35a needs to be replaced or not can be determined by measuring the wear amount difference.

As described above, in accordance with the wear amount measuring apparatus 70, the wear amount of the ceramic member 35a in the chamber 11 or the wear amount difference in the ceramic member 35a can be measured by the non-contact method without taking out the ceramic member 35a from the chamber 11. Therefore, the replacement timing of the ceramic member 35a or the like can be checked without deteriorating the operating rate of the substrate processing apparatus 10.

While the embodiments of the present invention have been described, the present invention is not limited thereto. For example, the thickness/temperature measuring apparatus or the wear amount measuring apparatus in accordance with the embodiment of the present invention is not limited to the substrate processing apparatus for performing plasma etching and may be applicable to a substrate processing apparatus for performing other vacuum processing. Further, a substrate processed by the substrate processing apparatus is not limited to a wafer W. For example, the substrate processing system of the present invention may process a substrate other than the wafer W, such as a glass substrate for use in a FPD (Flat Panel Display), a photomask, a CD substrate, a print substrate or the like.

While the invention has been shown and described with respect to the embodiments, it will be understood by those skilled in the art that various changes and modifications may be made without departing from the scope of the invention as defined in the following claims.

What is claimed is:

1. An apparatus for measuring at least a thickness of a ceramic member provided in a chamber maintained in a vacuum atmosphere, the apparatus comprising:
a terahertz wave generating unit configured to output a terahertz wave;
a terahertz wave analysis unit configured to analyze a terahertz wave; and
an optical system configured to guide the terahertz wave output from the terahertz wave generating unit to the ceramic member and guide reflected waves of the terahertz wave reflected from the ceramic member to the terahertz wave analysis unit, wherein the terahertz wave analysis unit obtains an optical path difference between a first reflection wave reflected from a front surface of the ceramic member and a second reflection wave reflected from a rear surface of the ceramic member and measures a thickness of the ceramic member based on the optical path difference.

2. The apparatus of claim 1, wherein the terahertz wave analysis unit obtains the optical path difference between the first reflection wave and the second reflection wave by performing Fourier transform of spectrum of the reflection wave from the ceramic member.

3. The apparatus of claim 1, further comprising a reference mirror configured to reflect the terahertz wave; and a driving unit configured to move the reference mirror in a direction parallel to an incidence direction of the terahertz wave, wherein the optical system guides the terahertz wave output from the terahertz wave generating unit to the reference mirror and guides a third reflection wave reflected from the reference mirror to the terahertz wave analysis unit; and the terahertz wave analysis unit obtains the optical path difference between the first reflection wave and the second reflection wave, based on a moving distance of the reference mirror in the case of moving the reference mirror and interference waveforms obtained by interference between the first and the second the reflection wave and the third reflection wave.

4. The apparatus of claim 1, wherein the terahertz wave analysis unit includes a storage device that stores data on correlation between a thickness of the ceramic member and a temperature of the ceramic member and obtains a temperature of the ceramic member based on the data and the measured thickness of the ceramic member.

5. The apparatus of claim 1, wherein the optical system splits the terahertz wave output from the terahertz wave generating unit into two terahertz waves respectively traveling along two paths having the same optical path length, guides the two terahertz waves to different portions of the ceramic member through the respective paths, and guides reflection waves from the different portions to the terahertz wave analysis unit; and the terahertz wave analysis unit performs Fourier transform on spectrum of the reflection waves from the different portions of the ceramic member, calculates an optical path difference between the reflection waves from rear surfaces of the different portions of the ceramic member, and obtains a thickness difference between the different portions based on the optical path difference.

6. A method for measuring at least a thickness of a ceramic member provided in a chamber maintained in a vacuum atmosphere, the method comprising:

making a terahertz wave incident on the ceramic member;

obtaining an optical path difference between reflection waves of the terahertz wave reflected from a front surface and a rear surface of the ceramic member; and obtaining the thickness of the ceramic member based on the optical path difference.

7. The method of claim 6, wherein the optical path difference is obtained by performing Fourier transform on spectrum of the reflection waves from the ceramic member.

8. The method of claim 6, further comprising:

splitting the terahertz wave so that a part of the terahertz wave is incident on a reference mirror for reflecting the terahertz wave; and obtaining the optical path difference between a first reflection wave reflected from the front surface of the ceramic member and a second reflection wave reflected from the rear surface of the ceramic member based on interference waveforms obtained by interference between the first and the second reflection wave and a third reflection wave reflected from the reference mirror and a moving distance of the reference mirror in the case of moving the reference mirror in a direction parallel to an incidence direction of the terahertz wave.

9. The method of claim 6, further comprising:

obtaining a temperature of the ceramic member based on the thickness of the ceramic member and previously obtained data on correlation between a thickness of the ceramic member and a temperature of the ceramic member.

10. A substrate processing system comprising:

a substrate processing apparatus including: a chamber in which a mounting table configured to mount thereon a substrate is provided, the chamber configured to perform a predetermined process on the substrate mounted on the mounting table in a vacuum atmosphere; a ceramic member provided in the chamber; and a window made of a material that transmits a terahertz wave and provided at the chamber, to introduce the terahertz wave into the chamber; and a thickness/temperature measuring apparatus configure to measure at least a thickness of the ceramic member, wherein the thickness/temperature measuring apparatus includes:

a terahertz wave generating unit configured to output a terahertz wave;

a terahertz wave analysis unit configured to analyze a terahertz wave; and an optical system configured to guide the terahertz wave output from the terahertz wave generating unit to the ceramic member in the chamber through the window and guide reflection waves of the terahertz wave reflected from the ceramic member to the terahertz wave analysis unit through the window, and wherein the terahertz wave analysis unit obtains an optical path difference between a first reflection wave from a front surface of the ceramic member and a second reflection wave from a rear surface of the ceramic member and measures a thickness of the ceramic member based on the optical path difference.

11. The substrate processing system of claim 10, wherein the terahertz wave analysis unit includes a storage device that stores data on correlation between a thickness of the ceramic member and a temperature of the ceramic member and obtains a temperature of the ceramic member based on the data and the measured thickness of the ceramic member.

* * * * *